United States Patent [19]
Lee et al.

[11] Patent Number: 5,411,902
[45] Date of Patent: May 2, 1995

[54] PROCESS FOR IMPROVING GALLIUM ARSENIDE FIELD EFFECT TRANSISTOR PERFORMANCE USING AN ALUMINUM ARSENIDE OR AN ALUMINUM GALLIUM ARSENIDE BUFFER LAYER

[75] Inventors: Hyong Y. Lee, Fairborn; Belinda Johnson, Dayton; Rocky Reston, Beavercreek, all of Ohio; Chris Ito, Colorado Springs, Colo.; Gerald Trombley, Centerville; Charles Havasy, Beavercreek, both of Ohio

[73] Assignee: The United States of America as represented by the Secretary of the Air Force, Washington, D.C.

[21] Appl. No.: 254,722

[22] Filed: Jun. 6, 1994

[51] Int. Cl.⁶ .......................................... H01L 21/338
[52] U.S. Cl. ................................ 437/40; 437/133; 437/177; 437/203
[58] Field of Search ................... 437/41, 44, 912, 203, 437/133, 40, 177

[56] References Cited

U.S. PATENT DOCUMENTS

| | | | |
|---|---|---|---|
| 4,717,685 | 1/1988 | Nakajima | 437/44 |
| 4,908,325 | 3/1990 | Berenz | 437/40 |
| 4,916,498 | 4/1990 | Berenz . | |
| 4,918,493 | 4/1990 | Geissberger et al. | 357/4 |
| 4,952,527 | 8/1990 | Calawa et al. | 437/107 |
| 4,962,050 | 10/1990 | Geissberger et al. | 437/22 |
| 4,994,868 | 2/1991 | Geissberger et al. . | |
| 5,026,655 | 6/1991 | Ohata | 437/40 |
| 5,049,951 | 9/1991 | Goronkin et al. . | |
| 5,084,743 | 1/1992 | Mishra et al. . | |
| 5,172,197 | 12/1992 | Nguyen et al. | 357/22 |
| 5,206,528 | 4/1993 | Nashimoto | 257/192 |
| 5,254,492 | 10/1993 | Tserng et al. | 437/56 |
| 5,281,543 | 1/1994 | Fukuzawa et al. | 437/29 |
| 5,300,795 | 4/1994 | Saunier et al. | 257/192 |

OTHER PUBLICATIONS

S. Swirhun, S. Hanka, J. Nohava, D. Grider, and P. Bauhahn, "Refractory self-aligned-gate, GaAs FET based circuit technology for high ambient temperatures", Proceedings of First International High Temperature Electronics Conference, pp. 295–300, 1991.

K. Fricke, H. L. Hartnagel, R. Schultz, G. Schweeger, and J. Wurfl, "A new GaAs technology for stable FET's at 300°C", IEEE Electron Dev. Lett., vol. 10, No. 12, pp. 577–579, 1989.

*Primary Examiner*—T. N. Quach
*Attorney, Agent, or Firm*—Bernard E. Franz; Thomas L. Kundert

[57] ABSTRACT

The incorporation of an aluminum arsenide (AlAs) buffer layer in a gallium arsenide (GaAs) field effect transistor (FET) structure is found to improve the overall device performance, particularly in the high temperature operating regime. Similar characteristics may be obtained from devices fabricated with an $Al_xGa_{1-x}As$ ($0.2 \leq x \leq 1$) barrier layer. At temperatures greater than 250° C., the semi-insulating gallium arsenide substrate begins to conduct significant amounts of current. The highly resistive AlAs buffer layer limits this increased conduction, thus permitting device operation at temperatures where parasitic leakage currents would impede or prevent device operation. Devices fabricated with AlAs buffer layers exhibited lower drain parasitic leakage currents and showed improved output conductance characteristics at 350° C. ambient temperature. The buffer layer will also improve the backgating problems which are detrimental to the operation of monolithic GaAs digital circuits having closely spaced devices under different bias conditions. An additional benefit of the high temperature capabilities of these devices is an improved reliability at conventional operating temperatures. Devices fabricated with this technology have shown an order of magnitude improvement in switching characteristics.

4 Claims, 1 Drawing Sheet

PROCESS FOR IMPROVING GALLIUM ARSENIDE FIELD EFFECT TRANSISTOR PERFORMANCE USING AN ALUMINUM ARSENIDE OR AN ALUMINUM GALLIUM ARSENIDE BUFFER LAYER

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a process for improving gallium arsenide field effect transistor performance using an aluminum arsenide or an aluminum gallium arsenide barrier layer.

The following papers are of interest.

(1) S. Swirhun, S. Hanka, J. Nohava, D. Grider, and P. Bauhahn, "Refractory self-aligned-gate, GaAs FET based circuit technology for high ambient temperatures", Proceedings of First International High Temperature Electronics Conference, pp. 295–300, 1991.

(2) K. Fricke, H. L. Hartnagel, R. Schutz, G. Schweeger, and J. Wurfl, "A new GaAs technology for stable FET's at 300° C.", IEEE Electron Dev. Lett., vol. 10, no. 12, pp 577-579, 1989.

S. Swirhun et al at Honeywell have tested FETs fabricated with a self-aligned gate(SAG) process, using dopant implants, isolation implants, tungsten silicide (Wsi) Schottky gates, NiGeNiInNiMo ohmic metal contacts, and SiN passivation. For a $1.1 \times 10$ $\mu$m FET, a drain current on-to-off ratio of about 30:1 was obtained at 350° C. ambient temperature.

K. Fricke et al from West Germany have fabricated FETs grown by metal-organic chemical vapor deposition (MOCVD) using TiPtAu Schottky gates GeAu-NiWSiTiWSiAu ohmic contacts, and SiN passivation. Their device test results are difficult to interpret because the results are shown at estimated temperature and not at the measured ambient temperature. In both cases, however, the switching current ratios were inferior by at least an order of magnitude to FETs fabricated with the AlAs buffer layer.

The following United States patents is of interest.
U.S. Pat. No. 5,300,795, - Saunier et al

SUMMARY OF THE INVENTION

An objective of the invention is to improve the overall device performance in a gallium arsenide (GaAs) field effect transistor (FET) structure, particularly in the high temperature operating regime.

According to the invention, the above objective is achieved by incorporation of an aluminum arsenide (AlAs) barrier layer. Similar characteristics may be obtained from devices fabricated with an $Al_xGa_{1-x}As$ ($0.2 \leq x \leq 1$) barrier layer. At temperatures greater than 250° C., the semi-insulating gallium arsenide substrate begins to conduct significant amounts of current. The highly resistive AlAs barrier layer limits this increased conduction, thus permitting device operation at temperatures where parasitic leakage currents would impede or prevent device operation. Devices fabricated with AlAs barrier layers exhibited lower drain parasitic leakage currents and showed improved output conductance characteristics at 350° C. ambient temperature. The barrier layer will also improve the backgating problems which are detrimental to the operation of monolithic GaAs digital circuits having closely spaced devices under different bias conditions. An additional benefit of the high temperature capabilities of these devices is an improved reliability at conventional operating temperatures. Devices fabricated with this technology have shown an order of magnitude improvement in switching characteristics over known and published results.

DETAILED DESCRIPTION

The incorporation of an $Al_xGa_{1-x}As$ ($0.2 \leq x \leq 1$) barrier layer in a gallium arsenide (GaAs) field effect transistor (FET) structure is found to improve the overall device performance, particularly in the high temperature operating regime. At temperatures greater than 250° C., the semi-insulating gallium arsenide substrate begins to conduct significant amounts of current. The $Al_xGa_{1-x}As$ barrier layer limits this increased conduction, thus permitting device operation at temperatures where parasitic leakage currents would impede or prevent device operation. Devices fabricated with AlAs barrier layers exhibited lower drain parasitic leakage currents and showed improved output conductance characteristics at 350° C. ambient temperature. Similar characteristics are expected from devices fabricated with $Al_xGa_{1-x}As$ ($0.2 \leq x \leq 1$) barrier layer. The barrier layer will also improve the backgating problems which are detrimental to the operation of monolithic GaAs digital circuits having closely spaced devices under different bias conditions. An additional benefit of the high temperature capabilities of these devices is an improved reliability at conventional operating temperatures.

Figure 1:
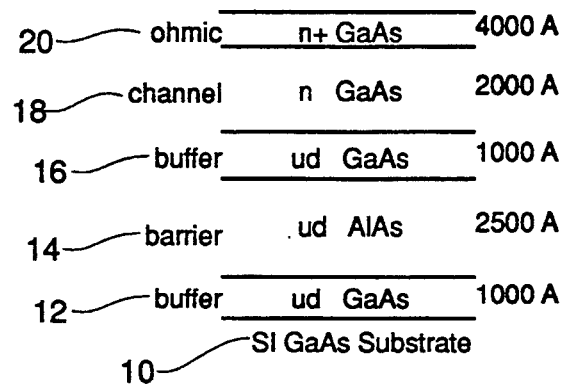
FIG. 1 is a diagram showing incorporation of an aluminum arsenide (AlAs) barrier layer in a gallium arsenide (GaAs) field effect transistor (FET) structure.

An example of a representative material structure grown by (MBE) molecular beam epitaxy is shown in FIG. 1. The device is formed on a semi-insulating GaAs substrate 10, with a 1000 Å thick undoped GaAs buffer layer 12, a 2500 Å thick undoped AlAs barrier layer 14, a 1000 Å thick undoped GaAs buffer layer 16, a 2000 Å thick n type GaAs channel layer 18, and a 400 Å thick n+ type GaAs ohmic layer 20. The AlAs barrier layer 14 is grown about 90° C. hotter than the GaAs layers to improve the quality of the AlAs layer and the subsequent channel layers. It is believed that this highly resistive AlAs layer electrically isolates the channel from the substrate, increasing the switching current ratio at high temperatures.

Figure 2:
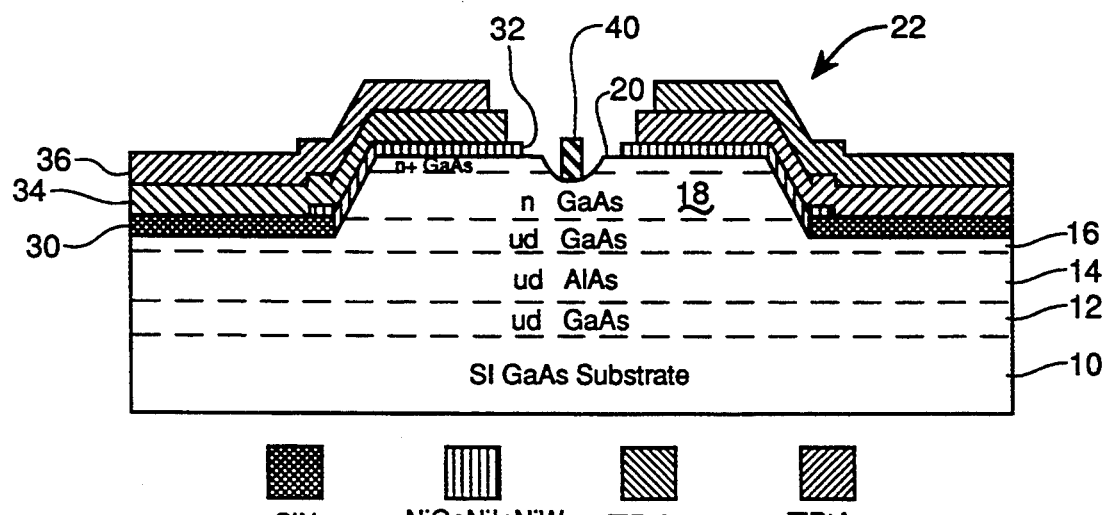
FIG. 2 is a diagram showing fabrication of a MESFET.

As an example of a specific implementation, consider the fabrication of the MESFET shown in FIG. 2, starting with the device of FIG. 1. The first step is the mesa definition using a light field mesa mask. The mesas 22 are isolated using a solution of $HF:H_2O_2:H_2O$ (1:1:8) as an etchant. Then, 1000 Å of SiN is deposited by plasma enhanced chemical vapor deposition (PECVD). This silicon nitride layer 30 serves to isolate the subsequent metal layers from the GaAs substrate 10. Next, the SiN covering the mesa is removed with a reactive ion etch (using an oxygen and FREON-14 CF$_4$ plasma) to facilitate the deposition of source, drain, and gate metals.

The ohmic source and drain metal 32 is patterned using a lift-off technique and consists of Ni, Ge, Ni, In, Ni, W layers 50, 25, 50 50, 50, and 450 Å thick, respectively. The NiGeNi layers are deposited by electron-beam evaporation, the InNi layers are deposited by thermal evaporation, and the W layer is deposited by RF magnetron sputtering. The ohmic contact 32 is rapid thermal annealed in a gas which is 90 Ar and 10% H$_2$ at 625° C. for 5 sec. These refractory ohmic contacts provide additional reliability at elevated temperatures.

Then, Ti, Pt, Au (300, 1000, and 3000 Å thick, respectively) interconnect metal 34 is electron-beam deposited. This metal layer interconnects the ohmic contact layer to the pads. Next Ti, Pt, Au (300, 1000, and 4000 Å thick, respectively) metal (36 & 40) is deposited as the gate metal to create a Schottky barrier 40 in the channel which is recessed in a prior step using a solution consisting of H$_3$PO$_4$:H$_2$O$_2$:H$_2$O (1:2:100) as the etchant. The gate metal also improves the overall conductivity.

ADVANTAGES AND NEW FEATURES

Drain current switching rations of 380:1 at 350° C. ambient temperature have been obtained for the 1×200 μm MESFET fabricated using the structure shown in FIG. 1 and the fabrication process described above. This is an order of magnitude improvement over the results obtained by S. Swirhun et al.

ALTERNATIVES

Al$_x$Ga$_{1-x}$As layer may be incorporated into other FET structures.

The FET material may be obtained by ion implantation, or from any of the currently employed growth methods for materials, such as MBE, MOCVD, liquid phase epitaxy (LPE), etc.

InGaAlP layer may substitute for Al$_x$Ga$_{1-x}$As as a barrier layer. In general the barrier layer may be $$In_{x1} Ga_{x2} Al_{1-x1-x2} As_{y1} P_{1-y1},$$

where $(0 \leq x_1 \leq 1)$, $(0 \leq x_2 \leq 1)$ and $(0 \leq y_1 \leq 1)$.

The ohmic metal may use variations of Ni, Si, Ge, In, W, and Mo, and Au.

The Shottky gate may be W, WN, TiWN, or WSi, of any composition.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A method of forming a gallium arsenide field effect transistor, comprising the steps of:
    forming a device by MBE on a semi-insulating GaAs substrate, comprising an undoped GaAs buffer layer about 1000 Å thick, an undoped AlAs barrier layer about 2500 Å thick, an undoped GaAs buffer layer about 1000 Å thick, an n type GaAs channel layer about 2000 Å thick, and an n+ type GaAs ohmic layer about 400 Å thick, the AlAs barrier layer being grown at a temperature about 90° C. above that of the GaAs layers to improve the quality of the AlAs layer and the subsequent channel layers;
    defining mesas on said device using a light field mesa mask, the mesas being isolated using a solution of HF:H$_2$O$_2$:H$_2$O (1:1:8) as an etchant;
    then, depositing about 1000 Å of SiN by plasma enhanced chemical vapor deposition(PECVD), the SiN layer serving to isolate subsequent metal layers from the GaAs substrate;
    next, removing the SiN covering the mesa to facilitate the deposition of source, drain, and gate metals;
    patterning the ohmic source and drain metal using a lift-off technique which comprises Ni, Ge, Ni, In, Ni, W layers about 50, 25, 50 50, 50, and 450 Å thick, respectively;
    depositing NiGeNi layers by electron-beam evaporation, the InNi layers being deposited by thermal evaporation, and the W layer being deposited by RF magnetron sputtering;
    rapid thermal annealing the ohmic contact in an 90/10% Ar/H$_2$ gas at 625° C. for 5 seconds, wherein these refractory ohmic contacts provide additional reliability at elevated temperatures;
    then, depositing Ti, Pt, Au, 300, 1000, and 3000 Å thick, respectively, as gate metal to create a Schottky barrier in the channel which is recessed in a prior step using a solution consisting of H$_3$PO$_4$:H$_2$O$_2$:H$_2$O (1:2:100) as the etchant, wherein the gate metal also improves the overall conductivity.

2. A method of forming a gallium arsenide field effect transistor as set forth in claim 1, wherein the step of removing the SiN covering the mesa comprises using an oxygen and FREON-14 CF$_4$ plasma as a reactive ion etch.

3. A method of forming a gallium arsenide field effect transistor, comprising the steps of:
    forming a device on a semi-insulating GaAs substrate, comprising an undoped GaAs buffer layer, a barrier layer, an undoped GaAs buffer layer, an n type GaAs channel layer, and an n+ type GaAs ohmic layer, the barrier layer being grown at a higher temperature than the GaAs layers to improve the quality of the barrier layer and the subsequent channel layers;
    wherein the barrier layer is In$_{x1}$ Ga$_{x2}$ Al$_{1-x1-x2}$ As$_{y1}$ P$_{1-y1}$, where $(0 \leq x_1 \leq 1)$, $(0 \leq x_2 \leq 1)$ and $(0 \leq y_1 \leq 1)$.
    defining mesas on said device;
    then, depositing SiN, the SiN layer serving to isolate subsequent metal layers from the GaAs substrate;
    next, removing the SiN covering the mesa to facilitate the deposition of source, drain, and gate metals;
    patterning the ohmic source and drain metal using layers of material selected from Ni, Si, Ge, In, W, Mo, and Au;
    depositing NiGeNi layers by electron-beam evaporation, depositing InNi layers by thermal evaporation, and depositing a W layer by RF magnetron sputtering;
    rapid thermal annealing the ohmic contact in a gas which is Ar and 10% H$_2$ at 625° C. for 5 seconds, whereby the ohmic contacts are refractory to provide additional reliability at elevated temperatures;
    then, depositing Ti, Pt, Au as gate metal to create a Schottky barrier in the channel.

4. A method of forming a gallium arsenide field effect transistor as set forth in claim 3, wherein the barrier layer is AlAs, x$_1$ and x$_2$ being 0, and y$_1$ being 1.

* * * * *